(12) United States Patent
Shafiee Ardestani et al.

(10) Patent No.: US 10,942,673 B2
(45) Date of Patent: Mar. 9, 2021

(54) DATA PROCESSING USING RESISTIVE MEMORY ARRAYS

(71) Applicant: Hewlett Packard Enterprise Development LP, Houston, TX (US)

(72) Inventors: Ali Shafiee Ardestani, Palo Alto, CA (US); Naveen Muralimanohar, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 573 days.

(21) Appl. No.: 15/571,340

(22) PCT Filed: Mar. 31, 2016

(86) PCT No.: PCT/US2016/025151
§ 371 (c)(1),
(2) Date: Nov. 2, 2017

(87) PCT Pub. No.: WO2017/171771
PCT Pub. Date: Oct. 5, 2017

(65) Prior Publication Data
US 2018/0113649 A1    Apr. 26, 2018

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0613* (2013.01); *G06F 3/0656* (2013.01);
(Continued)

(58) Field of Classification Search
USPC ...................................................... 708/835
See application file for complete search history.

(56) References Cited

U.S. PATENT DOCUMENTS 5,101,361 A    3/1992 Eberhardt
5,815,425 A    9/1998 Wong et al.
(Continued)

FOREIGN PATENT DOCUMENTS

CN    102341815 A    2/2012
CN    103430186 A    12/2013
(Continued)

OTHER PUBLICATIONS

International Search Report and Written Opinion received for PCT Patent Application No. PCT/US18/30125, dated Feb. 27, 2019, 11 pages.

(Continued)

*Primary Examiner* — Tan V Mai (57) ABSTRACT

In an example, a method includes receiving, in a memory, input data to be processed in a first and a second processing layer. A processing operation of the second layer may be carried out on an output of a processing operation of the first processing layer. The method may further include assigning the input data to be processed according to at least one processing operation of the first layer, which may comprise using a resistive memory array, and buffering output data. It may be determined whether the buffered output data exceeds a threshold data amount to carry out at least one processing operation of the second layer and when it is determined that the buffered output data exceeds the threshold data amount, at least a portion of the buffered output data may be assigned to be processed according to a processing operation of the second layer.

18 Claims, 5 Drawing Sheets

(51) Int. Cl.
*G11C 13/00* (2006.01)
*G06F 13/16* (2006.01)
*G06N 3/063* (2006.01)

(52) U.S. Cl.
CPC ............ *G06F 3/0688* (2013.01); *G06F 13/16* (2013.01); *G06N 3/063* (2013.01); *G11C 7/1006* (2013.01); *G11C 7/1039* (2013.01); *G11C 13/0002* (2013.01); *G11C 13/0023* (2013.01)

(56) References Cited

U.S. PATENT DOCUMENTS

| | | |
|---|---|---|
| 7,912,889 B1 | 3/2011 | Juffa et al. |
| 8,836,708 B2 | 9/2014 | Letellier et al. |
| 8,959,136 B1 | 2/2015 | Cheung et al. |
| 9,143,134 B1 | 9/2015 | Kutz et al. |
| 9,152,827 B2 | 10/2015 | Linderman et al. |
| 9,191,241 B2 | 11/2015 | Thevenin et al. |
| 9,640,256 B1 | 5/2017 | Roy et al. |
| 9,715,655 B2 | 7/2017 | Wu et al. |
| 9,847,125 B2 | 12/2017 | Friedman et al. |
| 9,910,827 B2 | 3/2018 | Muralimanohar et al. |
| 2014/0129498 A1 | 5/2014 | Bichler et al. |
| 2014/0172937 A1 | 6/2014 | Linderman et al. |
| 2014/0281184 A1 | 9/2014 | Dong et al. |
| 2015/0113223 A1 | 4/2015 | Brown et al. |
| 2017/0124025 A1 | 5/2017 | Gokmen |
| 2017/0316827 A1 | 11/2017 | Ge et al. |
| 2018/0082732 A1 | 3/2018 | Luo et al. |

FOREIGN PATENT DOCUMENTS

| | | |
|---|---|---|
| CN | 103778468 A | 5/2014 |
| WO | WO-2016018397 | 2/2016 |
| WO | WO-2017131792 | 8/2017 |
| WO | 2017/171771 A1 | 10/2017 |

OTHER PUBLICATIONS

Extended European Search Report received for EP Patent Application No. 16894800.8, dated Feb. 13, 2018, 09 pages.
Lifan Xu et al, Scaling Deep Learning on Multiple In-Memory Processors, Dec. 8, 2015, 7 Pgs.
Mahdi Nazm Bojnordi et al, Memristive Boltzmann Machine: A Hardware Accelerator for Combinatorial Optimization and Deep Learning, Mar. 12-16, 2016, 13 Pgs.
Ovtcharov et al., "Accelerating Deep Convolutional Neural Networks Using Specialized Hardware", http://research.microsoft.com/pubs/240715/cnn%20whitepaper.pdf (Research Paper), Feb. 22, 2015, 4 pages.
Ni, L. et al.; "An Energy Efficient Matrix Multiplication Accelerator by Distributed in Memory Computing on Binary Rram Crossbar"; Jan. 25-28, 2016; 6 pages.
International Search Report and Written Opinion, International Application No. PCT/US2016/025151, dated Dec. 28, 2016, pp. 1-12, KIPO.
Bojnordi, M., N., et al; "Memristive Boltzmann machine: A hardware accelerator for combinatorial optimization and deep learning"; Mar. 12, 2016. pp. 1-13.
Sharad, M., et al; "Energy-Efficient Non-Boolean Computing With Spin Neurons and Resistive Memory"; Jan. 1, 2014. pp. 23-34.
Ovtcharov et al., "Accelerating Deep Convolutional Neural Networks Using Specialized Hardware", Research Paper, Feb. 22, 2015, 4 pages.
Shafiee et al., ISAAC: A Convolutional Neural Network Accelerator with In-Situ Analog Arithmetic in Crossbars, 2016 (13 Pages).

DATA PROCESSING USING RESISTIVE MEMORY ARRAYS

STATEMENT OF GOVERNMENT RIGHTS

This invention was made with Government support. The Government has certain rights in the invention.

BACKGROUND

Resistive memory devices, such as 'memristors', have been described in which an electrical component is capable of being written with a resistance in a non-volatile manner. Use of arrays of such devices has been proposed for carrying out logical operations, for example in the context of 'deep learning' applications.

In some computing applications, for example deep learning applications, a logical operation is carried out on input data to provide an output in a first layer of processing. Logical operations are then carried out on the output in a subsequent layer of processing, in some examples for a plurality of iterations. Such a processing scheme has been proposed for use in fields such as big data analysis, image and speech recognition, machine learning and other computationally complex tasks.

BRIEF DESCRIPTION OF DRAWINGS

Non-limiting examples will now be described with reference to the accompanying drawings, in which.

DETAILED DESCRIPTION

Figure 1:
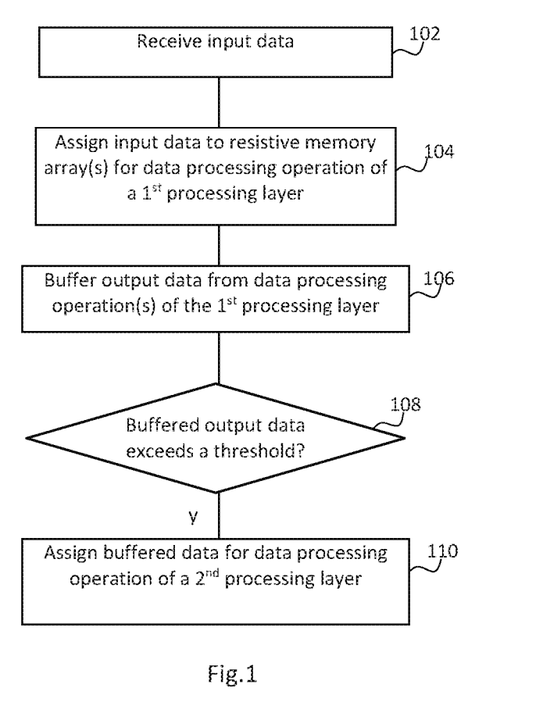
FIG. 1 shows an example method of processing in multiple processing layers.

FIG. 1 is an example of a method, which may be a computer implemented method, of carrying out processing in at least one layer of a multilayer processing task. In block 102, input data is received in a memory, which may for example be a data buffer and may be provided by dynamic random access memory (DRAM). In some examples, the memory may comprises embedded DRAM (eDRAM), which is provided on a chip or die on which processing apparatus to process the data is also provided. In other examples, other forms of memory (which may be embedded memory) may be provided.

The input data is to be processed in at least a first and a second processing layer, wherein the processing layers are to be applied to the data such that in the second processing layer a processing operation is carried out on output data of a processing operation of the first processing layer. In some examples, there may be more processing layers, for example on the order to 10, 20 or 30 processing layers, with each processing layer operating on an output of a preceding layer.

For example, a first layer of processing may operate on a stream of input data (sometimes termed channels), which may be any data, such as speech, hand writing, images, experimental data, etc. In each layer, a number of input channels may processed to form a number of output channels. The output channels may form the input channels of a further layer.

In some examples, for example from 'deep learning' processing techniques, data may be subjected to processing operations in one or several processing layers termed 'convolution' layers, in which an input channel is convolved with a pre-defined $n_x n$ kernel (which may be a matrix operand) to generate an output channel. Other layers may comprise at least one pooling layer, at least one transformation layer, and at least one classification layer. In a pooling layer, an input channel is down-sized by a pooling function (for example, providing a maximum, minimum, average, or the like) to produce an output. In a transformation layer, an input channel (which may be the output of a pooling layer) may be transformed to using a non-linear function such as tan h(x) (which is an example of a sigmoid function). This may form the input to a classification layer, in which the input may be convolved with a pre-defined 1×1 kernel. This layer may generate an output of the application.

Of these, the convolution process, which may be a multilayer process, may be the most computationally intensive and may account for around, or above, 80% of the computational resources. Therefore, in the examples below, a processing pipeline may be designed to accelerate processing of at least some convolution processing.

Block 104 comprises assigning the input data to be processed according to at least one processing operation of the first processing layer using at least one resistive memory array. In an example, a resistive memory array may comprise a two-dimensional grid of resistive memory elements, which may be a crossbar array. Such an array may be written by setting the resistive value of at least one resistive memory element. In some examples, the elements may be binary having one of two values for example, representing 0 or 1. However, resistive memory elements which can take a plurality of values, for example 32 distinct levels (which can represent 5 bits), have been demonstrated. A crossbar array of memristors or other resistive memory elements can process an input voltage vector to provide an output vector in which the input values are weighted by the conductance at each element of the array. This effectively means that the array performs a 'dot product' matrix operation on the input to produce an output (and thus such arrays have sometimes been termed 'dot product engines'). The weights of the elements can be 'programmed' by subjecting the elements to voltage pulses, each voltage pulse incrementally changing the resistance of that element. Such arrays are associated with high density, low power consumption, long cycling endurance and fast switching speeds.

In some examples, the resistive memory array to which the input data is assigned is written to represent an operand or a kernel, which may be suited to performing convolutions on input data.

Block 106 comprises buffering output data from at least one processing operation of the first layer carried out by a resistive memory array. The method further comprises, in block 108, determining whether the buffered output data exceeds a threshold data amount to carry out at least one processing operation of the second processing layer; and if so, in block 110, at least a portion of the buffered output data is assigned to be processed according to a processing operation of a second processing layer, which in some examples may be a processing operation using at least one resistive memory array.

In this way, the processing of the second processing layer may start when the threshold is reached (which may be before the processing of the first layer is complete, i.e. the threshold amount may be less than the total anticipated output of the first processing layer). In other words, rather than waiting for the first processing layer to be complete, and then sending the data for processing according to the second processing layer, at least one processing operation of the first and second layers may be performed in an overlapping time frame. This method may therefore provide a pipeline of data processing in which processing layers are carried out at least partially concurrently. This may speed processing and may reduce memory capacity specifications for holding the output of a layer as memory capacity may be reallocated once the output data has been provided to the second layer for processing.

In some examples, the threshold data amount is based on an amount of data sufficient to perform at least one processing operation of the second processing layer. In some such examples, the threshold data may be (or may be at least) the minimum amount of data sufficient to perform at least one processing operation of the second processing layer. This may assist in reducing memory capacity specifications. In some examples, the threshold amount may be related to the data output in a processing cycle of the first layer, i.e. the data may be output in 'units', each unit being output from a particular processing cycle, and the threshold may be related to a number of data units.

In some examples, the data may be assigned to different resistive memory arrays for the processing operation of the first and second processing layers.

In some examples, the resistive memory arrays which carry out the at least one processing operation of the second processing layer are within a processing unit comprising a memory (for example, as embedded memory such as eDRAM), and buffering the output data comprises buffering the output data in the memory of the processing unit to carry out the at least one processing operation of the second processing layer. In other words, the output data may be buffered at a location which is proximate to processing apparatus associated with the second layer (or more generally, with the subsequent layer of processing). This buffering may be a first or a subsequent buffering of the output data.

Figure 2:
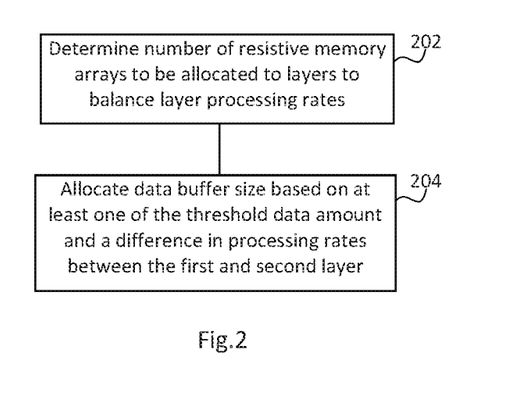
FIG. 2 shows an example method of allocating processing resources.

A method which may for example be used in setting up a processing apparatus to carry out the method of FIG. 1 is now described with reference to FIG. 2. In block 202, a number of resistive memory arrays to be allocated to a processing layer is determined based on the relative processing rates of the layers, wherein the determining is to balance processing rates of the layers.

In other words, more arrays may be assigned to layers in which the processing rate(s) of processing operations are slower than are assigned to layers in which the processing rate(s) are quicker, so as to even out the processing rates of each layer as a whole by increasing the parallelism within some layers compared to other layers. This determination may for example be so as to maximise the average usage of the arrays in the layers, such that the idle periods of the array(s) is reduced or minimised.

In an example, the second processing layer is associated with at least one input data buffer in which the output data of the first processing layer is buffered, and block 204 comprises allocating, by at least one processor, a size of a data buffer based on at least one of the threshold data amount (for example as discussed in relation to blocks 106 and 108 above) and a difference in processing rates (or a difference in processing rates of a processing operation) between the first and second layer.

In an example, a processing layer processes the content of the buffer using a $K_y$ array, which is applied to an input data portion in stages. This can be visualised as processing input data which falls within a moving window, wherein the movement of the window is specified in terms of strides and is illustrated with reference to FIG. 3a-c. In this example, the input data portion comprises a 6×6 array of values numbered 0 to 35, for example representing a feature map derived from an image, and the operating kernel is a 2×2 operating kernel. The kernel may first be convolved with the four values from the top left, shown in bold outline in FIG. 3a (values 0, 1, 6 and 7). In this example the 'stride' is one value in the y direction (one column) and two values in the x direction (two rows). The row wise shift is applied first. Thus, the next convolution carried out is between the operating kernel and the central block of values in the first two columns (values 2, 3, 8 and 9), shown in bold outline in FIG. 3b. The operand is applied as a sliding window down the rows, until all of the data blocks of the first two columns have undergone convolution. Then the 1-value column-wise shift is applied, such that the second and third values of the first and second rows (values 6, 7, 12 and 13) are processed as shown in bold outline in FIG. 3c. The processing in this layer may be characterised as having a stride $S_x=2$, $S_y=1$. The processing rate is determined by how many convolutions may be carried out in a unit time. Thus, if the kernel is represented by two similarly specified resistive memory arrays rather than one, different data portions may be convolved with each of the resistive memory arrays (i.e. two processing operations of the layer may be carried out at once) and the processing rate for that layer may be doubled.

In this example, it may be noted that each move of the kernel means that it operates on two new data values (i.e. two data values which were not included in the previous convolution). For example, in order to move the kernel from its position in FIG. 3a to FIG. 3b, values 8 and 9 should be received (values 2 and 3 would have been received previously). Thus, in order for this kernel to be used without idle periods, two new data values should be received from the previous layer in the time for a single processing operation in this layer. Therefore, in order to balance the processing rates, the previous layer may be allotted double the number of arrays to this example layer. It may be noted therefore that stride may be used to quantify a difference in processing rates; and/or that a determination of the resources in a layer may be made based on the stride(s) of the layer(s).

Figure 4:
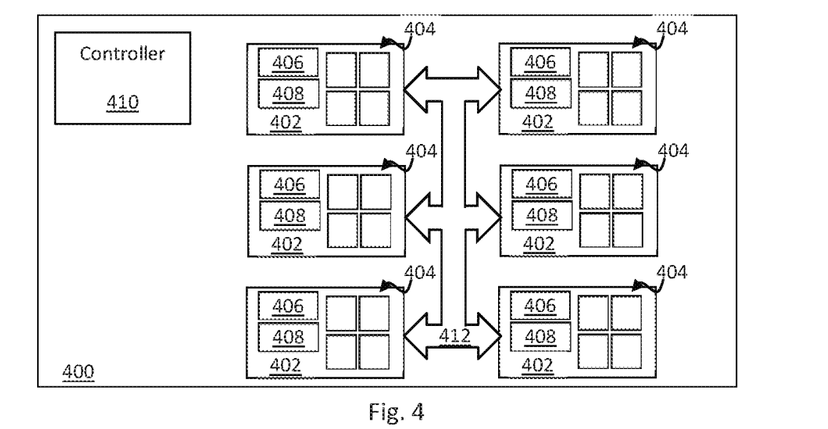
FIG. 4 is a simplified schematic of an example processing apparatus.

FIG. 4 is an example of a processing apparatus 400 comprising a plurality of processing units 402, wherein each of the processing units 402 comprises a plurality of resistive memory arrays 404, a buffer 406 and a control unit 408. Each of the resistive memory arrays 404 is for use in performing a processing operation in a layer of a multilayer processing task. At least one of the arrays 404 is to perform a processing operation in a different layer of the multilayer processing task than the layer of at least one other array. In other words, the processing apparatus 400, when in a particular state such that the arrays are written to represent operating kernels, comprises arrays 404 which are associated with the operands of multiple layers. In some examples, the arrays 404 of the processing apparatus 400 may represent all, or substantially all, of the convolution layers to be carried out using the arrays 404.

Each processing unit 402 may comprises a processing 'tile', and there may be at least one such tile on a die or a chip (if there a multiple tiles, some components, for example a buffer, may be shared in some examples). The buffer 406 may comprise an embedded memory, and may be to receive data for processing by the resistive memory arrays of the same processing unit 402. In some examples, the buffer 406 may be connected to the resistive memory arrays 404 of the processing unit 402 via a data bus which is configured to handle the maximum bandwidth to carry the buffered data to the arrays 404 within one data operation period (termed a 'stage' herein after) of the arrays 404. In some examples, the buffer 406 comprises a "first in first out" (FIFO) data buffer, and provides data storage in a column-wise manner. As data is received, this may be stored in the buffer 406. When the buffer 406 is full, the data may be overwritten such that new data will overwrite oldest data.

In this example, when the control unit 408 determines that sufficient data has been received in the buffer 406 to carry out a processing task using at least one of the arrays 404, it sends at least a portion of the data for processing with at least one resistive memory array 404, for example via a bus. An example of a processing unit 402 is described in greater detail with reference to FIG. 5 below.

Figure 3A:
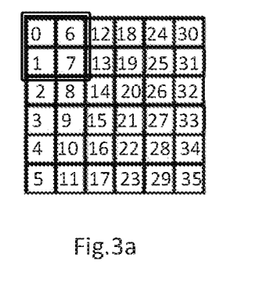
FIGS. 3a-c are simplified schematics of a section of an example memory.
Figure 3B:
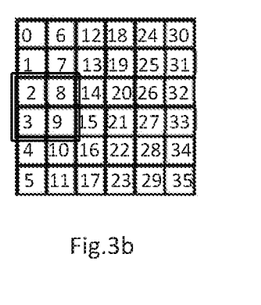
Figure 3C:
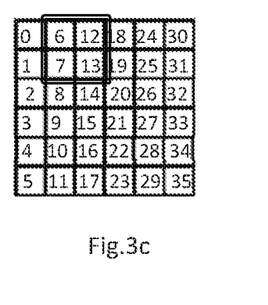

Referring to the example of FIG. 3, assuming that the data values are received in order, determining that sufficient data has been received in the buffer to carry out a processing task would comprises determining that data values 0-7 had been received, as the first convolution is carried out on data values 0, 1, 6 and 7.

In this example, the processing apparatus 400 further comprises a controller 410 to allocate at least one of resistive memory array capacity and memory capacity to each of the layers of the multilayer processing task. For example, the controller 410 may carry out the process of FIG. 2, or of FIG. 6 described below. The processing apparatus 400 in this example comprises an H-tree configuration, further comprises an interconnection link 412 between the processing units 402. In some examples, a different topology, for example a mesh, or a 'fat tree' topology, may be used.

Figure 5:
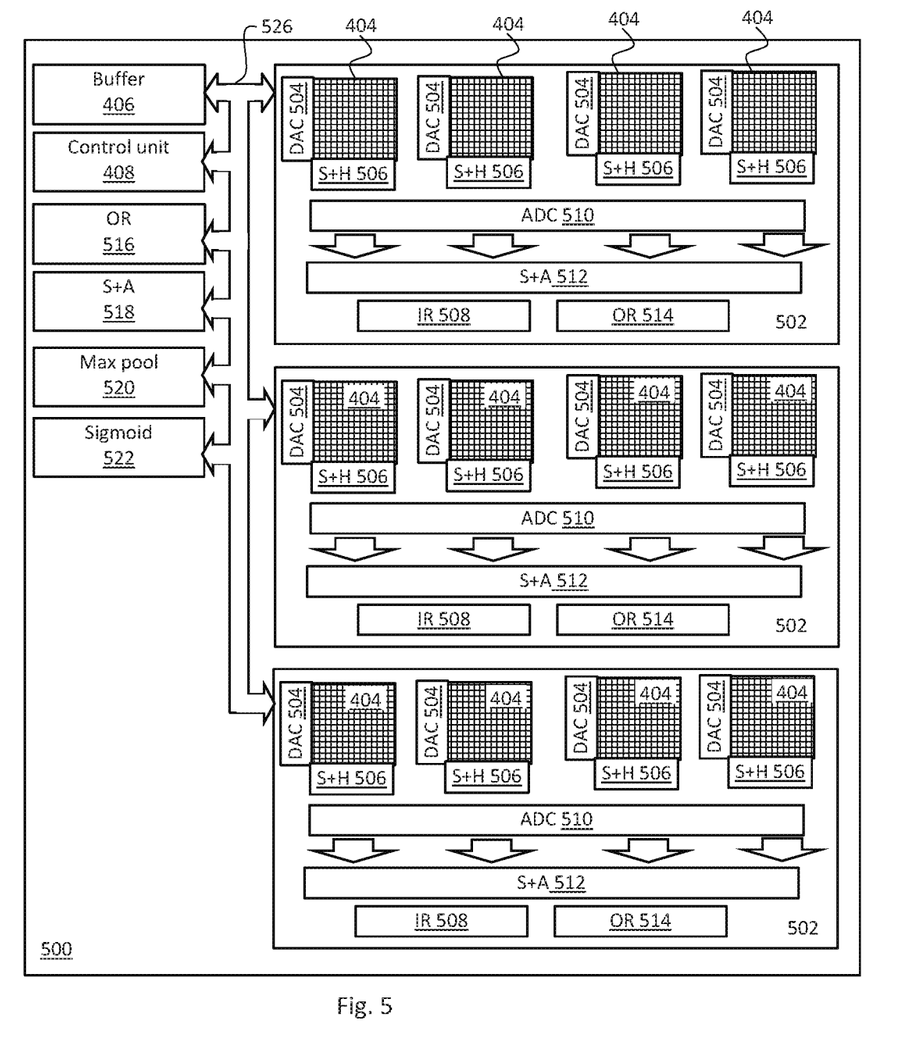
FIG. 5 is a simplified schematic of an example processing unit of a processing apparatus.

FIG. 5 shows an example of a processing unit 500, which could for example provide the processing unit 402 of FIG. 4, and in which like parts are labelled with like numbers. In this example, the arrays 404 are crossbar arrays, each with 128 rows and 128 columns, and four such arrays 404 are included in each of a plurality of In-situ Multiply-Accumulate (IMA) units 502. Each of the arrays 404 is associated with a Digital to Analogue Converter (DAC) unit 504 and a shift and hold (S+H) unit 506. The IMA units 502 further comprise an input register IR 508, an Analogue to Digital Converter ADC unit 510, a shift and add (S+A) register 512 and an output register OR 514.

The processing unit 500 further comprises at least one shared output register OR 516 which may store an output from a plurality of the IMA units 502 until all data portions which are to be processed the IMA units 502 of that processing unit 500 in that layer in a processing cycle are received thereby. The processing unit 500 further comprises processing apparatus which may be used in the conjunction with the IMA units 502, comprising a shift and add (S+A) unit 518, a max-pool unit 520, and a sigmoid unit 522. A bus 526 links the buffer 406, the IMA units 502 and the other processing apparatus.

In an example of processing using the processing unit 500 for an arbitrary processing layer i, a data input (for example a number of input feature maps $N_i$, each comprising 16-bit values) may be received. Subsequent operations may be carried out in stages with a stage time dictated by the slowest stage, which may comprise reading an array 404, and be on the order of 100 ns. In the first stage, the buffer 406 (for example comprising eDRAM) is read to provide a data portion, for example 256 16-bit inputs. These values are sent over the bus 526 to the IMA unit(s) 502 comprising array(s) 404 allocated to carrying out the processing of layer i and are recorded in the input register 508. In this example, the input register 508 has a maximum capacity of 1 KB and is implemented with SRAM. The bus 526 and the buffer 406 may be specified such that an entire copy of up to 1 KB of data from buffer 406 to the input register 508 is performed within a 100 ns stage. Once the input values have been copied to the input register 508, the IMA unit 502 carries out dot-product operations for the next 16 stages. In the next 16 stages, the buffer 406 is ready to receive other inputs and may address this data to other IMA unit(s) 502 of the processing unit (e.g., the control unit 408 may direct data based on a context from which a layer may be identified to IMA unit(s) 502 for that layer).

Returning to the IMA unit 502 to which data has been sent, in this example, over the next 16 stages, the IR 508 feeds 1 bit at a time for each of the 256 input values to the arrays 404. The first 128 bits are sent via the respective DAC units 504 to a first and second array 404, and the next 128 bits are sent to a third and fourth array 404. In this example, layer i is performing a convolution with a 4×4 shared kernel and the kernel stride (Sx and Sy) is equal to one.

Layer i performs a dot-product operation with a 4×4×16 matrix, i.e., 256 multiply-add operations are carried out. 32 such operations may be carried out in parallel to produce 32 outputs. This may be achieved with 256 array rows. Because each of these 32 operations is performed across 8 2-bit memristor cells in a row, this may be achieved with 256 array columns. In some examples, this may be the size of a single array, but in other examples, this may be represented by multiple arrays. In this example, the 256×256 rows and columns may be represented across the four arrays 404 of size 128×128 in an IMA unit 502. In this example, the four array 404 of single IMA unit 502 may perform the computations of layer i, although arrays from multiple IMA units 502 may carry out the processing of layer i.

At the end of each 100 ns stage, the outputs are latched in the Sample & Hold units 506. In the next stage, these outputs are fed to the ADC unit 510. The results of the ADC unit 510 are then fed to the shift-and-add register 512, where the results are merged with the output register 514 in the IMA unit 502. The output register 514 in this example is a 128B SRAM structure, although it may have other sizes and/or comprise a different memory type in other examples. In this example, the output register 514 produces 32 16-bit values over a 16-stage period. In each stage, the results of the ADC unit 510 are shifted and added to the value in the output register 514. Since in this example, the stage is a 100 ns stage, this allows 100 ns to update up to 64 16-bit values, which may be achieved with four parallel shift-and-add units, which represents a small area overhead.

At the end of stage 19 (to briefly recap, stages 1-18 comprising one stage to receive data, 16 stages to process the data, one stage for 'sample and hold' operations, and one stage for 'shift and add' operations, as described above), the output register 514 in the IMA unit 502 has its final output value. This is sent over the bus 526 to the central output register 516 (via the shift and add unit 518 if the convolution is spread across multiple IMA units 502). The central output register 516 contains the final results for layer i at the end of stage 20. Thus, in this example, the processing cycle (i.e. the time for data to be accessed, processed and a result returned) for the example layer i comprises 20 stages. In the meantime, the IMA unit 502 for layer i may have already begun processing its next inputs (for example the next processing cycle for layer i), so may be continuously busy in every stage (i.e. processing cycles for layer i may be interleaved, or carried out at least partially concurrently). In addition, the data output from layer i may then be passed for processing in layer i+1 while at least one processing unit continues to carry out at least one processing operation of layer i (i.e. at least one processing operation (a processing cycle, or a stage thereof) of layer i and at least one processing operation of layer i+1 may be carried out in an overlapping time frame, or in other words, at least some processing in layer i may be carried out concurrently with some processing in layer i+1). In other examples, if multiple IMA units 502 are used in a processing layer, then another shift and add or add to combine results stage may be used to combine the outputs for the multiple IMA units 502.

In some examples, the output data may be processed by an IMA unit 502 of the same processing unit 500, or may be sent to a buffer of another processing unit 500. In an example, the contents of the central output register 516 may be processed in at least some layers by the sigmoid unit 522, for example in a stage 21, which may operate as a smoothing function, applying a sigmoid function such as tan h(x) to the output. In stage 22, the sigmoid results may be written to another buffer 406, which may specifically be a buffer 406 associated with array(s) 404 which are written with kernels to be applied in the next processing layer, i+1. In such an example, the processing cycle for layer i may comprise 22 stages. If this is another IMA unit 502 of the same processing unit 500, this buffer 406 may be the buffer 406 used to store the inputs for layer i+1. In some examples, the same processing unit 500 may be used unless at least one component or class of components thereof (for example the buffer 406, or the IMA units 502) is/are fully utilised.

The max-pool unit 520 may be used in order to convert multiple values into fewer values. In an example, layer i may output 32 outputs to be fed to layer i+1 that performs a max-pool operation on every 2×2 grid on each filter. The 32 down-sized filters are then fed as input to layer i+2. In this case, in layer i+1, each max-pool operation may comprise a filter which produces four values every 64 stages (16 stage for an IMA unit 502 to complete convolution to generate an output). Hence, a max-pool operation may be performed every 64 stages per filter. Since there are 32 such filters generating outputs in parallel, max-pooling for 32 filters may be performed in parallel every 64 stages. The results of the max-pool may be written to a buffer 406 of the processing unit 500 used for layer i+2 in stage 27.

Thus it may be noted that it need not be the case that each layer of the multilayer processing utilises resistive memory arrays 404. In some layers, other processor types may be used to operate on data.

Figure 6:
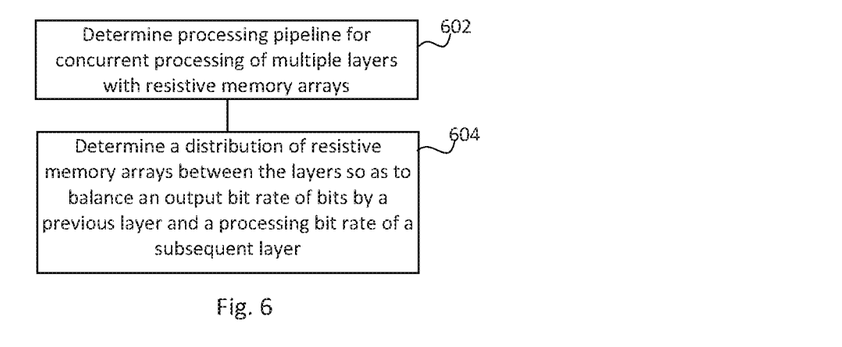
FIGS. 6 and 7 show example methods of allocating processing resources.

FIG. 6 is an example of a method, which may in some examples be a method for use in setting up a processing apparatus such as the processing apparatus 400 of FIG. 4.

Block 602 comprises determining a processing pipeline for multiple layers of processing using resistive memory arrays, wherein for each layer after a first layer, processing is carried out on the output of a preceding layer; and wherein the processing for at least two layers is to be carried out at least partially concurrently.

Block 604 comprises determining an allocation of processing resources for the processing pipeline, the allocation comprising determining a distribution of resistive memory arrays between the layers so as to balance an output bit rate of bits by processing of a previous layer and a processing bit rate in processing of a subsequent layer.

As has been discussed above with reference to FIGS. 3*a-c*, processing of a subsequent layer may, in some examples described herein, be commenced once sufficient bits have been received from a previous layer. Considering the example of FIG. 3 (but assuming a stride of 1 rather than 2), this means that bits 0-7 are received from a previous layer before the next layer processing commences. When a previous layer i−1 produces output data value 8, it may be placed in the input buffer for layer i. At this point, value 0 is no longer useful and can be removed from the input buffer. Thus, every new output produced by layer i−1 allows layer i to advance the kernel by one stage and perform a new operation of its own. In this example, a set of inputs (which may comprise feature maps) is fed to $N_{of}$ convolutional kernels to produce $N_{of}$ output feature maps. Each of these kernels may a different column in a resistive memory array may operate on a set of inputs in parallel.

As has been mentioned above in relation to FIGS. 2 and 3, if a $K_x \times K_y$ kernel may be moved by strides $S_x$ and/or $S_y$ after every stage. If for example $S_x=2$ and $S_y=1$, the previous layer i−1 has to produce two values before layer i can perform its next processing operation. More generally, the number of output values produced by layer i−1 in order for the level i processing operation to be performed is a function of stride values associated with level i. This could cause an unbalanced pipeline where the arrays of layer i−1 are busy in every cycle, while the arrays of layer i may be idle in some cycles, for example alternating between being busy and idle in alternate cycles. To balance the pipeline, the resources allocated to layer i−1 may be doubled by replicating the synaptic weights representing the kernel(s) for layer i−1 in a different array so that two different input vectors can be processed in parallel to produce two output values in one cycle.

Figure 7:
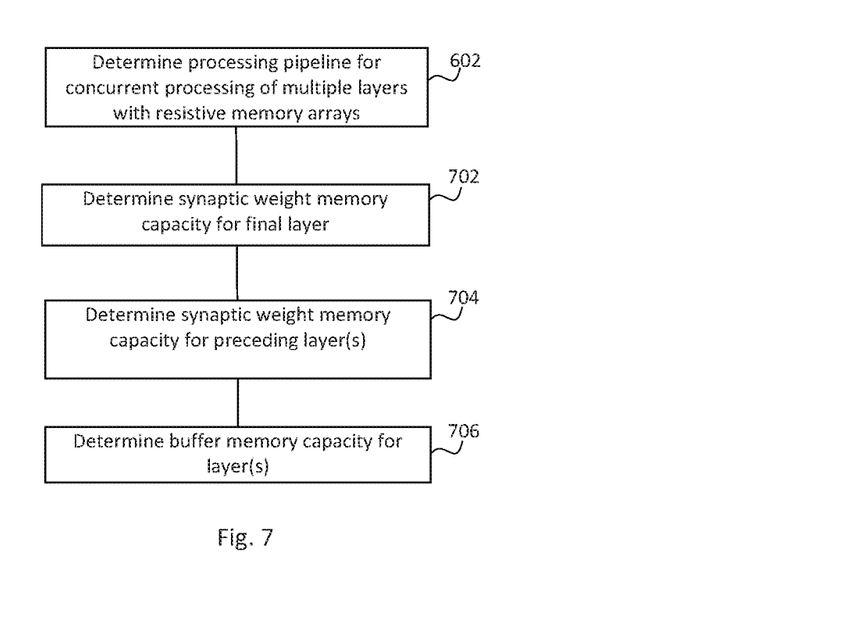

FIG. 7 comprises a method including block 602 of FIG. 6. In this example, blocks 702 and 704 are an example of determining a distribution of resistive memory arrays as described in block 604 by allocating a synaptic weight memory capacity to each of the layers, the memory capacity being for storing synaptic weights. This may comprise allocating the total bit capacity of all arrays to be used in processing that layer (the elements of these arrays represent the 'weights' which are to be applied to the input values, termed synaptic weights in the field of neural networks, by analogy with brain synapses). In block 702, the memory capacity for a final layer is determined according to the number of data portions to be processed (for example, a number of input feature maps for that layer $N_{if}$), the number of data portions to be output (for example, a number of output feature maps for that layer $N_{of}$), and the size of an operand to operate on the data portions (for example, the kernel size $K_x \times K_y$, where $K_y$ and $K_x$ are the number of columns and rows in the kernel).

For example, if the last layer is expected to produce outputs in every cycle, it may be allocated with memory to store $K_x \times K_y \times N_{if} \times N_{of}$ synaptic weights.

Block 704 comprises determining the synaptic weight memory capacity to be allocated for at least one preceding layer. This may be determined according to the number of data portions to be processed (N), the number of data portions to be output $N_{of}$, the size of an operand to operate on the data portions (for example, the kernel size $K_x \times K_y$) and the output bit rate of processing operations carried out in the processing layer (for example, determined based on the stride, such that the memory allocation increases when the stride is higher, or conversely when output bit rate of the processing operations is lower).

In an example, the synaptic weight memory allocated for layer i may be $K_{xi} \times K_{yi} \times N_{ifi} \times N_{ofi} \times S_{xi+1} \times S_{yi+1}$. This therefore allows the weights for layer i to be stored multiple times if $S_{xi+1}$ or $S_{yi+1}$ is greater than one In some examples, if the aggregate storage specification exceeds the available storage on a chip by a factor (for example by a factor of two) then the storage allocated to every layer except the last may be reduced by the factor. In such an example, the pipeline remains balanced and most arrays may be busy in every cycle; but the very last layer may perform an operation and produces a result in some cycles and not others (if the factor is a factor of two, a result may be produced in every alternate cycle).

Determining the synaptic weight specification of each layer may then lead to an allocation of arrays to each layer, as the synaptic weights may be represented by the elements of the arrays.

Block 706 comprises allocating a buffer memory capacity to each of the layers, the buffer memory capacity being to store input data for processing in the layer, wherein the buffer memory capacity is determined based on the number of data portions (which may for example comprise feature maps) to be processed (NO) in parallel (i.e. how many processing operations are carried out at one time), the number of rows of an input feature map to be processed with each array, and the size of an operand to operate on the data portions (for example, the kernel size $K_x \times K_y$).

For example, a buffer may be allocated to comprise storage space for at least: $((N_x \times (K_y-1))+K_x) \times N_{if}$, where $N_x$ is the number of rows in the input feature map, $K_y$ and $K_x$ are the number of columns and rows in the kernel, and $N_{if}$ is the number of input feature maps for the layer.

It may be noted that, if the entire layer was to be processed and the output feature maps stored, this would suggest a buffering capacity of $N_x \times N_y \times N_{if}$ from layer i−1 before starting layer i. Thus, by starting one layer while a previous layer continues, this may reduce the specified buffering capacity by around $N_y/K_y$.

In the examples above, the control units 408 of the processing units 402 may route the data between layers. However, in other examples, the controller 410 may route the data, and/or there may be a central buffer as well as or in place of the buffers 406 of the processing units 402. In some examples, data portions which are addressed in a particular layer are kept in a destination register (one of which may be provided for each layer) which is accessible to the controller 410 and/or the control units 408.

Figure 8:
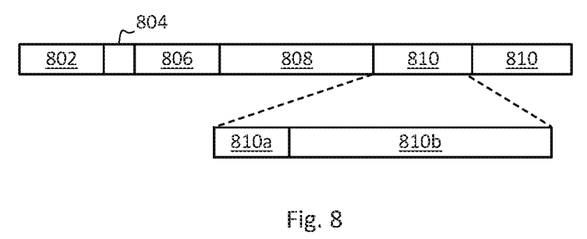
FIG. 8 is a schematic representation of an example of a data packet.

FIG. 8 shows an example of a data packet 800 which may be received by a processing unit 402, 500. The data packet 800 in this example comprises routing information 802, which comprises network metadata such as a destination identifier identifying a processing unit 402, 500, Virtual Circuit information 804, a layer index 806, an indication of the number of data pieces 808 (which in this example is two), and at least one data piece 810. In this example each data piece 810 comprise an input index 810a and a plurality of data bits 810b. The number of data bits may be the same as the number of input rows of an array 404.

On receipt of such a data packet 800, in one example, processing unit 402, 500 may operate according to the following data flow:

An incoming data packet 800 may be unpacked, for example in a depack unit of a control unit 408 of a processing unit 402. The layer index 806 may provide an index to a mapping table which is accessed by the control unit 408 to identify the IMA unit 502 and/or arrays 404 by which each data piece 810 is to be processed. The input index 810a of a data piece 810 may be used in the event that one layer has multiple data pieces.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams (for example, the controllers 410, the control unit 408, the max-pool unit 520, the sigmoid unit 522 and the like). In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
receiving, in a memory, input data to be processed in a first processing layer and a second processing layer, wherein a processing operation in the second processing layer is carried out on an output of a processing operation of the first processing layer, and a processing operation of the first processing layer is carried out using at least one resistive memory array;
assigning the input data to be processed according to the processing operation of the first processing layer;
buffering output data from the processing operation of the first processing layer;
determining that the buffered output data exceeds a threshold data amount to carry out the processing operation of the second processing layer, wherein the threshold data amount is less than a total anticipated value of the output data processed by the first processing layer; and
upon determining that the buffered output data exceeds the threshold data amount, assigning at least a portion of the buffered output data to be processed according to the processing operation of the second processing layer.

2. The method of claim 1 in which the threshold data amount is further based on an amount of data sufficient to perform the processing operation of the second processing layer.

3. The method of claim 1 further comprising performing the processing operation of the first processing layer and the second processing layer in an overlapping time frame.

4. The method of claim 1 further comprising assigning input data to different resistive memory arrays for the processing operation of the first processing layer and the second processing layer.

5. The method of claim 1, in which the processing operation of the second processing layer is carried out using a resistive memory array, and the resistive memory array is within a processing unit comprising a memory, and wherein buffering the output data comprises buffering the output data in the memory of the processing unit to carry out the processing operation of the second processing layer.

6. The method of claim 1 in which each layer is associated with a processing rate, the method comprising determining, by at least one processor, a number of resistive memory arrays to be allocated to a processing layer based on relative processing rates of the layers, wherein the determining is to balance processing rates of the layers.

7. The method of claim 1 in which the output data of the first processing layer is buffered in at least one input data buffer of the second processing layer, the method comprising allocating, by at least one processor, a size of a data buffer based on at least one of the threshold data amount; a difference in processing rates between the first and second processing layer; and a difference in processing rates of a processing operation of the first processing layer and a processing operation of the second processing layer.

8. The method of claim 1, wherein the first processing layer and the second processing layer are convolution layers and the input data is convolved with a pre-defined kernel.

9. The method of claim 1, wherein the processing operation of the first processing layer comprises performing a dot product matrix (DPM) operation on the input data using the resistive memory array.

10. The method of claim 1, further comprising:
assigning a second resistive memory array to the second processing layer to further reduce an idle period of the second processing layer.

11. A processing unit comprising:
a plurality of resistive memory arrays;
a buffer; and
a control unit,
wherein each resistive memory array in the plurality of resistive memory arrays is for use in performing a processing operation in a layer of a multilayer processing task,
wherein the buffer is to receive input data to be processed in a first processing layer and a second processing layer,
wherein a processing operation in the second processing layer is carried out on an output of a processing operation of the first processing layer, and a processing operation of the first processing layer is carried out using at least one resistive memory array; and
the control unit of the processing unit is to:
determine that the output data exceeds a threshold data amount to carry out the processing operation using the second processing layer; and
upon determining that the output data exceeds the threshold data amount, send the output data for processing with the second processing layer.

12. The processing unit of claim 11 further comprising at least one output register to store an output from the plurality of resistive memory arrays until all data portions which are to be processed by resistive memory arrays of that processing unit in a processing cycle of a layer are received.

13. The processing unit of claim 11 in which at least one array is to perform a processing operation in a first layer of the multilayer processing task and at least one array is to perform a processing operation in a second layer of the multilayer processing task.

14. The processing unit of claim 11 further comprising at least one of a shift and add unit, a max-pool unit, and a sigmoid unit.

15. The processing unit of claim 11 in which the control unit comprises a plurality of in-situ multiply-accumulate units each comprising the plurality of resistive memory arrays associated with at least one shift and hold unit.

16. A method comprising:
determining a processing pipeline for multiple layers of processing using resistive memory arrays, wherein for each layer after a first layer, processing is carried out on an output of a preceding layer, and wherein processing for at least two layers is to be carried out at least partially concurrently; and
determining an allocation of processing resources for the processing pipeline, wherein the allocation of processing resources for the processing pipeline is to:
determine that output data exceeds a threshold data amount,
upon determining that the output data exceeds the threshold data amount, assign at least a portion of the output data to be processed according to a processing operation of a subsequent layer, wherein the allocation of processing resources distributes the output data between at least two of the layers so as to balance an output bit rate of bits by processing of a previous layer and a processing bit rate in processing of the subsequent layer.

17. The method of claim 16 in which determining an allocation of processing resources comprises determining a synaptic weight memory capacity for each of the layers, the synaptic weight memory capacity being for storing synaptic weights, wherein the synaptic weight memory capacity for a final layer is determined according to a number of data portions to be processed, a number of data portions to be output, and a size of an operand to operate on the data portions; and wherein the synaptic weight memory capacity for at least one preceding layer is determined according to the number of data portions to be processed, a number of data portions to be output, and the size of an operand to operate on the data portions and an output bit rate of processing carried out in the layer.

18. The method of claim 16 further comprising allocating a buffer memory capacity to each of the layers, the buffer memory capacity being to store input data for processing in the layer, wherein the buffer memory capacity is determined based on the number of data portions to be processed, a number of parallel operations to be carried out on the data portions, and the size of an operand to operate on the data portions.

* * * * *